United States Patent [19]

Hunsinger et al.

[11] Patent Number: 4,485,363

[45] Date of Patent: Nov. 27, 1984

[54] SIGNAL PROCESSOR USING SURFACE ACOUSTIC WAVES

[75] Inventors: Billy J. Hunsinger, Mahomet; Sears W. Merritt, Elgin; David A. Swanson, Mt. Prospect, all of Ill.

[73] Assignee: Gould, Inc., Rolling Meadows, Ill.

[21] Appl. No.: 334,779

[22] Filed: Dec. 28, 1981

[51] Int. Cl.[3] ........................ H03H 9/72; H03H 9/64; G06G 7/195

[52] U.S. Cl. ................................ 333/193; 333/17 R; 333/196; 364/821; 310/313 R

[58] Field of Search ................................ 333/150-155, 333/193-196, 166, 17 R, 17 L, 1, 2; 364/819-821; 328/133, 134; 310/313 A, 313 B, 313 C, 313 D, 313 R; 331/107 A; 330/5.5

[56] References Cited

U.S. PATENT DOCUMENTS

| | | | |
|---|---|---|---|
| 3,600,708 | 8/1971 | King | 333/17 L |
| 3,833,867 | 9/1974 | Solie | 330/5.5 X |
| 4,037,174 | 7/1977 | Moore et al. | 333/193 |
| 4,224,683 | 9/1980 | Adkins | 333/150 X |
| 4,288,765 | 9/1981 | Mikoshiba et al. | 333/195 |
| 4,353,043 | 10/1982 | Gunton | 333/195 X |

OTHER PUBLICATIONS

Grant et al.—"Programmable Transversal Filtering Using the Surface Acoustic Wave Diode Convolver", Wave Electronics, 1 (1974/1976); pp. 381-386.

*Primary Examiner*—Marvin L. Nussbaum

*Attorney, Agent, or Firm*—K. H. Pierce; Edward E. Sachs

[57] ABSTRACT

A signal processor for filtering unwanted narrowband noise from received wideband electrical signals also containing desired wideband noise is described. The signal processor includes means for partitioning the wideband received signal into a plurality of narrowband, noise-containing signals and for producing a plurality of narrowband output signals. The signal processor further includes means for monitoring each of the narrowband output signals and for reducing the voltage of any narrowband output signal when that signal exceeds a predetermined level. In the preferred embodiment, the monitoring means of the signal processor includes a plurality of voltage-regulating networks, wherein each network receives as a network input signal, a single one of said narrowband output signals into a detector and integrator network to produce an output command signal only when the voltage across a channel exceeds a predetermined level. The command voltage is used to reduce the voltage of the output of the narrowband channels accordingly.

30 Claims, 4 Drawing Figures

SIGNAL PROCESSOR USING SURFACE ACOUSTIC WAVES

BACKGROUND OF THE INVENTION

1. Field of the Invention

The present invention relates generally to matched filtering devices and more specifically to surface-acoustic-wave convolvers.

2. Description of the Prior Art

In signal-processing technology, it is sometimes necessary to filter a wideband noise from a received wideband electrical signal to recover a desired signal that is in a coded information format. A wideband signal can be defined, very generally, to be a signal which exists over a frequency bandwidth that is greater than the minimum bandwidth required to convey the information of interest. In some cases, information may be spread over a relatively wide bandwidth, such that the energy of the information signal is less than the energy of unwanted noise coexisting in the frequency band containing the signal. In signal-processing technology, it may be necessary, for example, to filter wideband noise from a wideband electrical signal in order to retrieve a relatively small-amplitude, wideband information signal that is underlying the wideband noise signals. In the past, wideband surface-acoustic-wave convolvers have been used to filter wideband noise from the desired signal to be monitored. In these devices, a reference signal, which is a replica of the wideband information code signal but inverted from front to back with respect to a predetermined time period, is generated as a surface acoustic wave by an input surface-acoustic-wave transducer. Similarly, the received signal, which contains the desired wideband information signal and the wideband noise signal, is generated as a surface acoustic wave by another input surface-acoustic-wave transducer. Each of these waves travel toward one another and convolve with one another on a convolver plate between the two transducers. The convolution of the two surface acoustic waves is detected by a convolver output transducer located on the convolver plate between the two input transducers. The convolution of the two waves produces matched filtering of the reference signal with the received signal to reduce the wideband noise in the received signal with respect to the desired information signal.

One problem with designing wideband surface-acoustic-wave devices is the difficulty of making a wideband convolver which is linear over the entire frequency range of a wideband signal. Another problem with wideband convolvers is that the output from the matched filtering convolution process may be useless if a narrowband noise signal having a relatively large amplitude is present in the received signal.

As a solution to the first of the above-mentioned problems, a type of wideband convolver has recently been developed which is made up of a plurality of narrowband surface-acoustic-wave devices in which each narrowband device is designed to operate over succeeding portions of the entire wideband bandwidth. Each narrowband convolver may, for example, operate in a bandwidth of 8 MHz. Therefore, to cover a wideband signal ranging from 60 MHz to 124 MHz, it may be desirable to use eight narrowband surface-acoustic-wave devices. It should be noted that with this type of configuration, it is not necessary that each channel operate over an equal bandwidth range. In such a device, a plurality of narrowband signal-processing devices may be placed in parallel. The output from all of the surface-acoustic-wave devices may then be coherently recombined to provide a processed wideband output signal. Thus, it may be possible to effectively process a wideband signal with a plurality of narrowband surface-acoustic-wave devices.

However, as alluded to above, another problem with wideband convolvers is that the signal-processing capability of a wideband convolver may be rendered useless by a narrowband noise signal having a relatively large amplitude. It is to this problem that the present invention is directed.

SUMMARY OF THE INVENTION

A signal processor for filtering both unwanted narrowband and wideband noise from wideband electrical signals is described. The signal processor includes means for partitioning the wideband signal into a plurality of narrowband, information-containing signals and for producing a plurality of narrowband output signals. The subject signal processor is further provided with means for monitoring each of the narrowband output signals and for reducing the amplitude of any narrowband output signal when that signal exceeds a predetermined level.

Thus, it can be seen that an object of the present invention is the provision of a means for filtering narrowband noise signals having a relatively large amplitude from the signal to be processed.

Another object is to provide a signal-processing device capable of operating effectively in the presence of a narrowband noise signal having a relatively large amplitude.

A further object of the invention is the provision of a surface-acoustic-wave convolver which is relatively inexpensive to manufacture and simple to use.

Still another object is to provide a surface-acoustic-wave device having a naarrowband-noise-filtering capacity which is rather simple to implement.

Other objects, advantages and novel features of the present invention will become apparent from the following detailed description of the invention when considered in conjunction with the accompanying drawings.

DETAILED DESCRIPTION OF THE PREFERRED EMBODIMENT

Figure 1A:
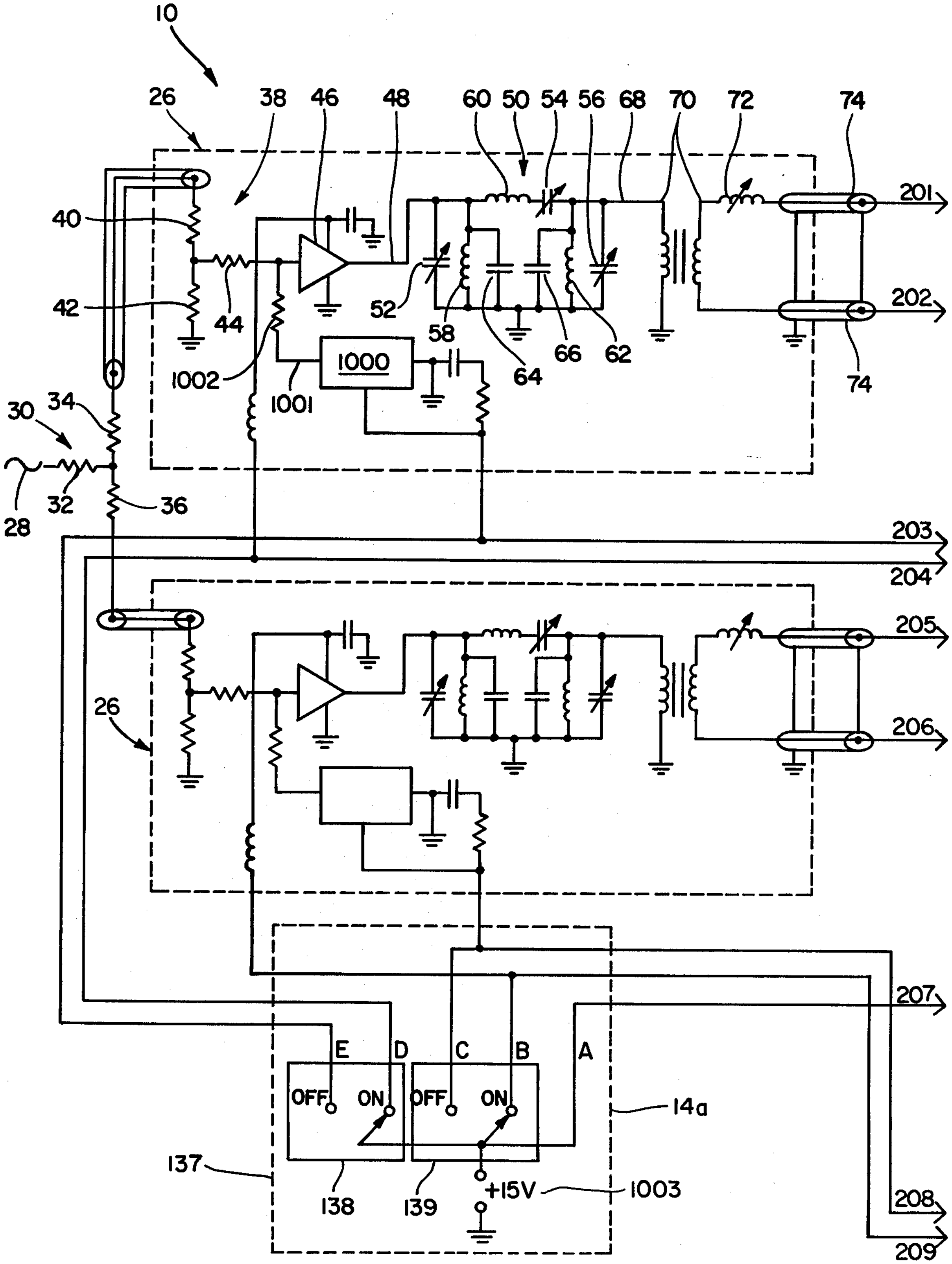
FIG. 1a, b, and c is a schematic diagram of a two-channel, surface-acoustic-wave convolver system using manual switches to regulate the output power of each of the convolver channels.
Figure 1B:
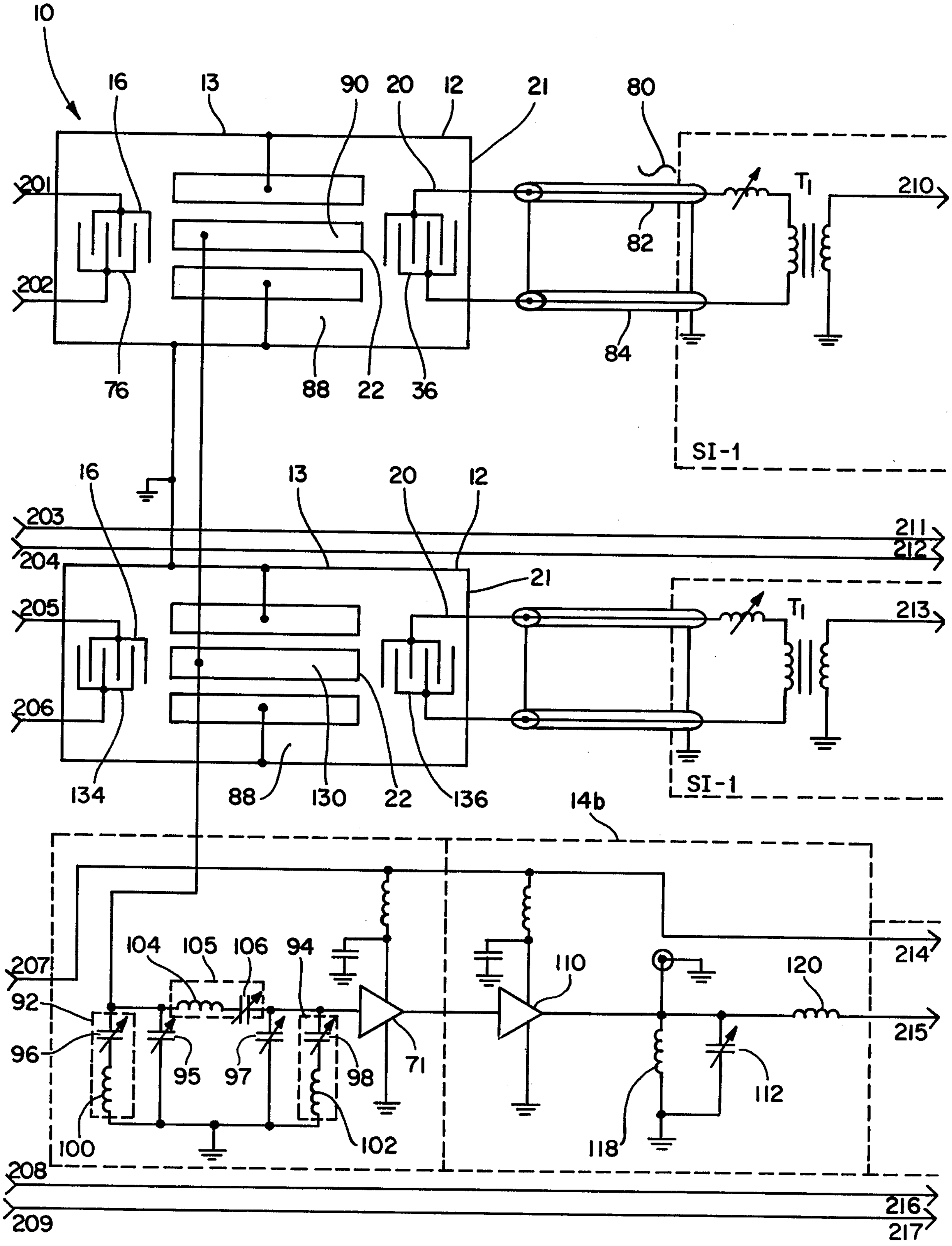
Figure 1C:
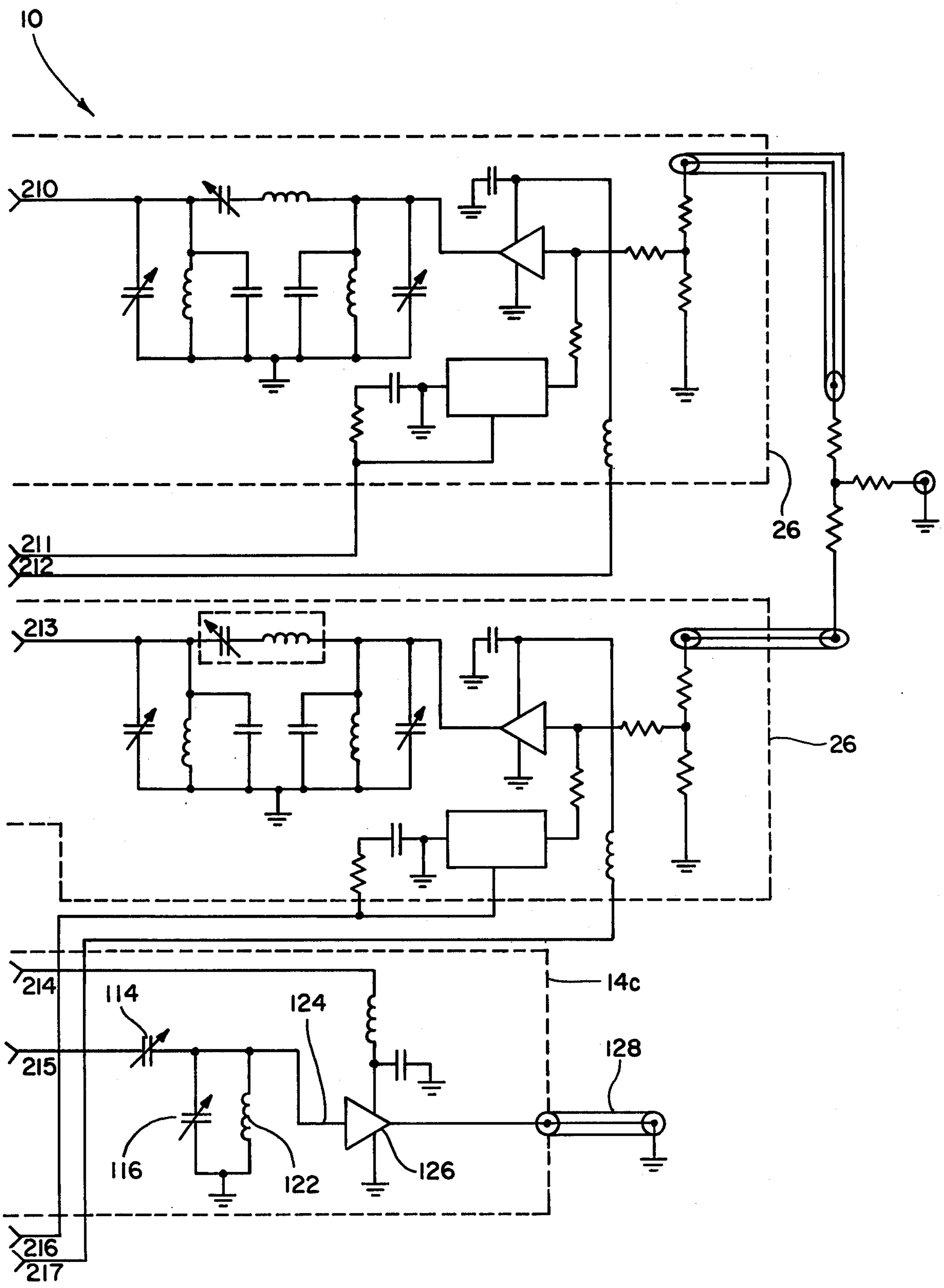

Referring now to FIG. 1, the subject development comprehends the provision of a signal processor 10 for filtering both unwanted narrowband and wideband noise from a received wideband electrical signal also containing a desired signal in a coded information format. The processor 10 includes a means 12 for partitioning a received wideband signal and a reference wideband signal that is functionally related to the coded information format into a plurality of narrowband received and reference signals. The processor 10 further includes means 13 for convolving the narrowband received and reference signals with one another to filter the wideband noise from the received signal and to generate a plurality of narrowband output signals. The subject development further includes a means 14*a, b,* and *c* for monitoring each of the narrowband output signals and for reducing the voltage of any narrowband signal when the output signal exceeds a predetermined level.

In the embodiment of FIG. 1, the partitioning means 12 may include a means for converting the received wideband signals into surface acoustic waves. In the embodiment of FIG. 1, the signal partitioning means 12 may, more particularly, include a first plurality of narrowband surface-acoustic-wave transducers 16. Each transducer is chosen to be operative over successive narrowband frequency ranges extending substantially throughout the frequency range of the wideband received signal. Some overlap of the frequency range of each transducer with respect to the next succeeding transducer may be desirable in some circumstances. The transducers convert the received wideband electrical signal into a plurality of narrowband received signals in the form of surface acoustic waves. Similarly, a second plurality of narrowband surface-acoustic-wave transducers 20 may be provided to convert the reference wideband signal into a plurality of narrowband, reference, surface-acoustic-wave signals. Typically, the reference signal will be a replica of the wideband information code format that has been reversed from front to back with respect to a predetermined period of time. The bandwidth of the partitioned reference signals substantially corresponds to the bandwidth of the partitioned received signals. As can be seen in FIG. 1, a plurality of surface-acoustic-wave channels 21 are provided. Each channel 21 conducts one of the partitioned received and reference acoustic waves toward one another so as to allow the reference signal wave to convolve with the received signal wave. Matched filtering of the reference wave with the received wave effectively reduces the level of the noise in the output of each partitioned channel with respect to the desired signal.

In most instances, it is desirable to condition the wideband received signals and wideband reference signals prior to feeding them into the partitioning means 12. In these instances, a signal-conditioning means 26 may be provided. In the embodiment illustrated in FIG. 1, the identical circuitry is used to condition both the received and reference wideband signals. It is, therefore, necessary to describe the circuitry of only one of the signal-conditioning means 26 in detail.

An input signal 28 is transmitted into a power splitter 30 consisting of resistors 32, 34 and 36. The power splitter is used for matching purposes to maintain an input impedance of 50 ohms into the signal-conditioning means 26. For instance, if input signal 28 is transmitted to the power splitter 30 on a coaxial cable having a 50 ohms impedance, it is desirable to match the impedance of the coaxial cable with the input impedance of the signal-conditioning means so that both are 50 ohms. The power splitter 30 performs this purpose. A portion of the input signal 28 is then transmitted to a voltage divider 38 consisting of resistors 40, 42 and 44. The voltage divider 38 conditions the impedance of the input signal into amplifier 46. The amplifier serves two purposes. One purpose is to add additional power to the input signal because the input signal is small and surface-acoustic-wave convolvers are relatively inefficient. Another purpose of the amplifier is to isolate the signal-conditioning means 26 from noise that may be picked up by surface-acoustic-wave transducer 16 or 20. Output from the amplifier 48 is fed into a three-pole bandpass filter 50. The bandpass filter consists of variable capacitors 52, 54 and 56, inductors 58, 60 and 62, and capacitors 64 and 66. The purpose of the three-pole bandpass filter is to reduce frequency components in the amplifier output signal 48 that were generated due to the nonlinear characteristics of amplifier 46. In particular, the three-pole bandpass filter eliminates harmonics generated by the amplifier 46. The output 68 from the three-pole bandpass filter is transmitted to transformer 70. One purpose of the transformer is to create a "floating output", that is, to prevent the input to the transducer 16 or 20 from becoming grounded during operation of the subject signal processor 10. The transformer 70 further serves to provide isolation of any fundamental frequency currents which may be generated by transducer 16 or 20 from entering into amplifier 71. An inductor 72 is provided to produce an impedance which matches the impedance of transducer 16 or 20. The signal-conditioning means 26, thus, produces a conditioned output signal 74 which differs from input signal 28 in that frequency components of the input signal that are the same frequency as the frequencies of a convolution output signal, discussed below, are eliminated.

The conditioned output signal 74 is fed into an interdigital transducer 16 or 20. The interdigital transducer 16 or 20 creates surface acoustic waves which are transmitted along a center electrode commonly called a convolver plate 22. Convolver plate 22 will be discussed in more detail hereinbelow.

As previously noted, each of the signal-conditioning means 26 is identical to one another. Thus, each convolver plate 22 receives two acoustic signals. One acoustic signal is generated by surface-acoustic-wave transducer 16. This signal contains a narrowband portion of a conditioned wideband received signal from one of the signal-conditioning means 26. The other acoustic signal is generated by surface-acoustic-wave transducer 20 located on the other side of convolver plate 22. This acoustic signal contains a narrowband portion of a conditioned wideband reference signal from an identical signal-conditioning means 26. The acoustic signals contain only a narrowband portion of the wideband electrical signals from means 26 because of the construction of transducers 16 and 20. The surface-acoustic-wave vibrations are created on a piezoelectric material 88 by surface-acoustic-wave transducers 16 and 20. As previously noted, the transducers may be in the form of interdigital transducers. Interdigital transducer 16 is substantially identical to interdigital transducer 20 for each channel. Each transducer is positioned such that the acoustic wave from transducer 16 travels along convolver plate 22 towards transducer 20, and the acoustic wave from transducer 20 travels in the opposite direction along convolver plate 22 towards transducer 16. Thus, the surface-acoustic waves generated by transducers 16 and 20 travel toward one another and through one another to create an electrical convolution signal in the convolver plate 22. The desired convolution signal is in the form of a frequency signal equal to the sum of the frequencies of the desired signal, embedded in the received signal, and the reference signal.

In the embodiment illustrated in FIG. 1, the output from each convolver plate 22 is transmitted to a means 14 for monitoring the narrowband output signals. The means 14 consists of filters and amplifiers. The convolution signal is first transmitted to a signal conditioner consisting of a three-pole bandpass filter composed of parallel circuits 92 and 95, 94 and 97, and series circuit 105. Each resonant trap 92, 94 consists of a variable capacitor 96, 98 in series with inductors 100, 102, respectively. These resonant traps are adjusted by capacitors 96, 98 to eliminate, or trap, any electrical signals transmitted from the convolver plate 22 that contain frequency components of the received signal or the reference signal. These resonant traps, in parallel with variable capacitors 95, 97, and with inductor 104 and variable capacitor 106 in series, form the three-pole bandpass filter. The two traps 92 and 94, together with the impedance-matching three-pole bandpass filter, effectively pass all frequencies in the region of the convolution signal and reject, or suppress, any frequencies outside that region. The resonant traps and three-pole bandpass filter further act to match the impedance of amplifier 71. The impedance of the convolver plate may typically range from 1 to 10 ohms. The function of amplifier 71 and succeeding amplifier 110 is to boost the output convolution signal from the convolver plate 22. The output from the amplifier 110 is conditioned by a three-pole bandpass filter consisting of variable capacitors 112, 114 and 116, and inductors 118, 120 and 122, as illustrated in FIG. 1. This filter is adjusted to pass signals at frequencies equal to the sum of the frequencies of the reference signal and the desired signal (i.e., the convolution signal) and to reject signals present at substantially different frequencies. And finally, the output from the three-pole bandpass filter at 124 is fed into amplifier 126 to create an output signal along coaxial cable 128. In the embodiment illustrated in FIG. 1, the output signal along coaxial cable 128 may be monitored manually through an oscilloscope or other voltage-indicating means. When it appears that the voltage produced at the output averaged over time from either convolver plate 90 or convolver plate 130 becomes too large, indicating the presence of excessive unwanted narrowband noise, the input to either of the convolver plates may be shut off by manual switches 138 or 139. Manual switches 138 or 139 control a power supply voltage 1003 that is applied to signal conditioning means 26. When a manual switch, for example switch 138, is in the "on" position, power supply voltage 1003 is applied to amplifier 46, allowing it to operate. When manual switch 138 is in the "off" position, power supply voltage 1003 is removed from amplifier 46 and applied to switch mechanism 1000. Switch mechanism 1000 may be a mechanical relay or solid-state device that grounds point 1001 when power supply voltage 1003 is applied to it. Switch mechanism 1000 is energized when switch 138 is in the "off" position. In this position, resistor 1002 is grounded. This compensates for any impedance discontinuities that occur when amplifier 46 is disconnected from the power supply. When manual switch 138 is in the "on" position, power supply voltage 1003 is removed from switch mechanism 1000 causing an open circuit condition at point 1001.

As will be obvious to one skilled in the art, the embodiment illustrated in FIG. 1 is a prototype system to demonstrate that the subject development will effectively produce the results desired. That is, that it is possible to eliminate a strong narrowband noise signal from a wideband signal. In the embodiment illustrated in FIG. 1, only two channels are used. Transducers 76 and 36 are designed to produce a maximum output in the range of 47 to 53 MHz, while transducers 134 and 136 are designed to have a maximum output in the range of 53 to 59 MHz. Thus, if, for instance, the narrowband unwanted noise signal is in the range of 47 to 53 MHz, it will be possible to eliminate this noise by turning off the signal to convolver plate 90 by placing manual switch 138 in the "off" position. In actual practice, it may be desirable to use as many convolver plates as possible with slightly overlapping bandwidth ranges to be able to eliminate a narrow bandwidth noise signal, and yet, maintain as much of the wide bandwidth signal as possible. Of course, the number of convolver plates used in any particular device would be limited by size and economic considerations, as well as by the electrical and mechanical properties of the specific type of convolver device used.

Figure 2:
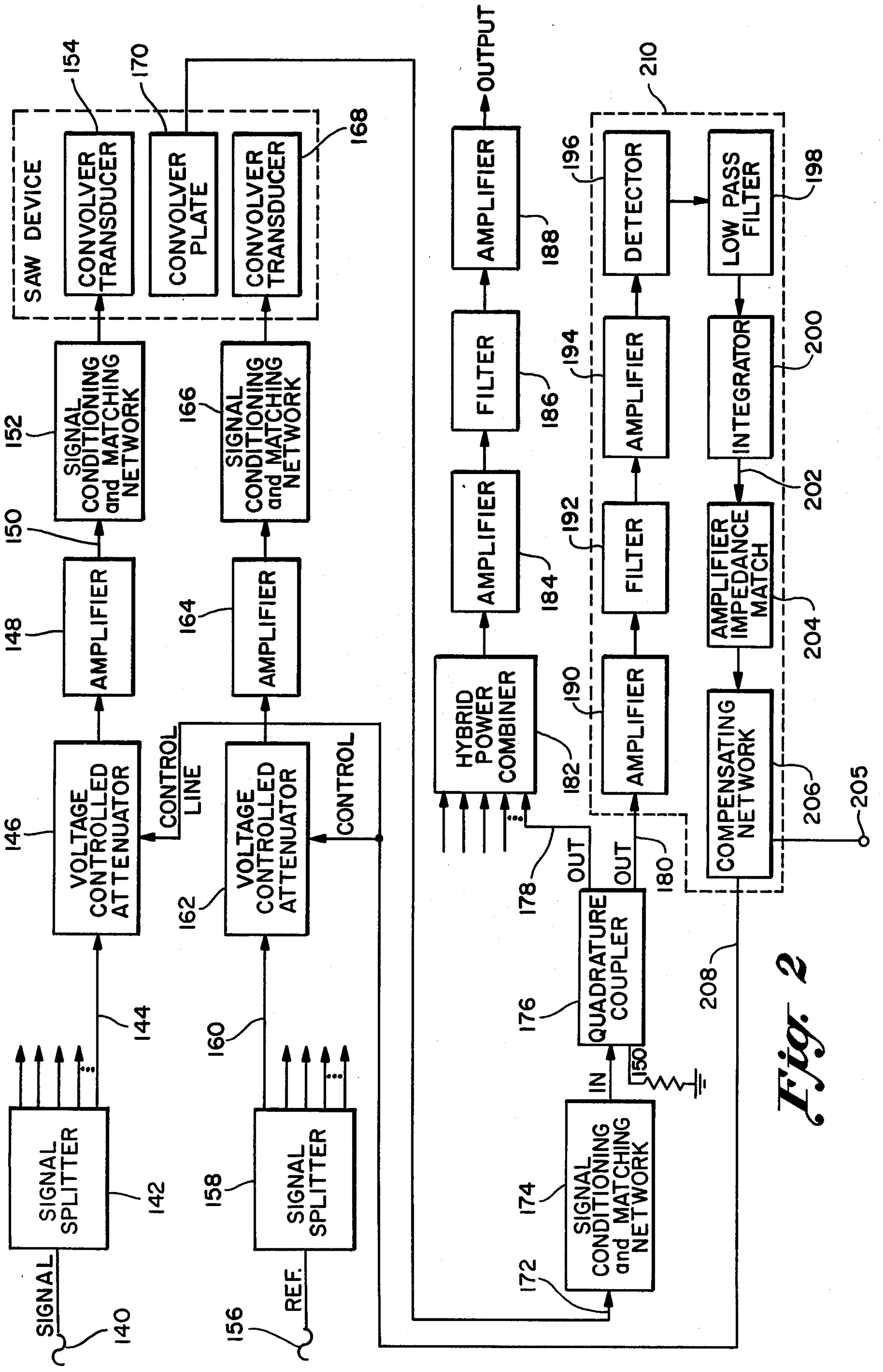
FIG. 2 is a block diagram of a multichannel, surface-acoustic-wave convolver system using automatic gain control circuits to regulate the output level of each of the convolver channels.

FIG. 2 is a block diagram of an embodiment of the subject convolver including circuitry for automatic monitoring and filtering undesired narrowband noise. An input signal 140 to be monitored is fed into a signal splitter 142 which divides the signal into "n" outputs where "n" equals the number of surface-acoustic-wave convolvers used in the system. It is envisioned in this embodiment that the circuitry would be essentially identical for each convolver channel, although component values in signal-conditioning network 152 may be optimized for the individual frequency channels. Therefore, only one channel is illustrated and described. If, for example, eight convolver channels are used, the signal splitter would split the received input signal to be monitored 140 into eight identical and equal amplitude output signals. An Anzac Model DS-309 may be appropriate for this purpose. A single channel 144 from the signal splitter would then be fed into a voltage-controlled attenuator 146. The purpose of the voltage-controlled attenuator is to attenuate the signal in accordance with the voltage of the control signal 208 produced by automatic control circuit 210. A voltage-controlled attenuator, for example a Watkins-Johnson Model WJ-G1, may be typically used for this purpose. The output from the voltage-controlled attenuator 146 is then fed into an amplifier 148 to boost the signal from the voltage-controlled attenuator. The output 150 is then fed into a matching and signal conditioning network 152 to match the impedance of the output from the amplifier 148 to the impedance of a convolver transducer 154. The purpose of the matching network is to minimize reflections from the convolver transducer 154 and to maximize power transmission from the amplifier 148 into the transducer 154. It is also desirable to eliminate any harmonic signals generated in amplifier 148.

In a similar manner, a reference signal 156 functionally related to a wideband information code format signal that has been purposefully included in the received signal 140 may be applied to a second signal splitter 158. In some cases, the reference signal may be a replica of the wideband noise signal that has been inverted with respect to a predetermined period of time. Similar to signal splitter 142, signal splitter 158 divides the reference signal 156 into "n" output signals. One output signal 160 may be fed into a voltage-controlled attenuator 162 having the same purpose and design as voltage-controlled attenuator 146. Output from the voltage-controlled attenuator 162 is then fed into amplifier 164 which, similarly, has the same design and function as amplifier 148. Output from amplifier 164 is fed into matching and signal-conditioner network 166, which is similar to matching and signal-conditioning network 152. The output from matching network 166 is fed into a second convolver transducer 168. Convolver transducers 154 and 168 convert their respective signals from matching networks 152 and 166 into surface acoustic waves which are transmitted along convolver plate 170. It should be noted that each convolver channel processes different frequency bands. The convolver plate 170 convolves the surface acoustic waves from transducers 154 and 168 according to the following equation:

$$a(t) = \int_{-T/2}^{+T/2} f(\tau)g(2t - \tau)d\tau$$

where f is a surface wave signal generated by one transducer; g is the surface wave signal generated by the other transducer; T is the time it takes a surface wave signal to traverse the length of the convolver plate; t is time; $\tau$ is a variable over which the above integration is performed; and a represents the convolution signal.

Thus, the wideband noise included in input signal 140 will be effectively suppressed by reference signal 156 through the convolver plate 170 so that the output from the convolver plate will have a much greater signal-to-noise ratio than the original input signal 140. The output 172 from the convolver plate may then be fed into an impedance-matching and signal-conditioning network 174 to remove any frequency components in the convolver output not related to the convolution signal and to create a 50 ohms impedance output signal as required by most conventional circuitry. The output from the impedance matching and signal-conditioning network 174 may be fed into a quadrature coupler 176 to isolate convolver plate 170 from other convolver channels (not shown) in the system. An Anzac Model JH-131 may be used for this purpose, depending, once again, on the other circuitry used in this embodiment. The quadrature coupler 176 divides the signal into first and second isolated output signals 178 and 180, respectively.

The first output signal 178 from the quadrature coupler is fed into a hybrid power combiner 182. The power combiner, of course, combines all first output signals from each convolver channel to create a wideband output signal. An Anzac Model DS-309 may be used for this purpose when there are eight convolver channels used, and other design considerations are met. It may then be desirable to feed the output from hybrid power combiner 182 into an amplifier 184 to boost the signal. The output from amplifier 184 may be then fed into a filter 186 to reduce frequency components not related to the convolution signal. The output from filter 186 may be then fed into a second amplifier 188 to further amplify the signal according to design criterion purposes. A Watkins-Johnson Model A-71 may be used for element 184 and a Watkins-Johnson A-75 may be used for element 188 in some embodiments.

The second output signal 180 from the quadrature coupler may be fed into an amplifier 190 to boost the output signal 180. After the signal has been amplified by amplifier 190, it may be desirable to filter the signal with filter 192 and then further amplify the signal with a second amplifier 194. The particular amplifiers and filters used would, of course, depend on the bandwidths of the signal to be amplified, the voltage of the original signal, and the desired voltage of the output signal. A Watkins-Johnson Model A-71 amplifier may be used for amplifier 190 and a Watkins-Johnson Model A-75 may be used for amplifier 194, depending on the design considerations listed above. Output from amplifier 194 may be fed into a detector 196 to detect the amplitude of the signal from amplifier 194. A variety of detectors may be used; for example, an envelope detector, a rectifier detector or a full-wave rectification detection system. The output from the detector 196 may then be fed into a low-pass filter 198 which allows low-frequency signals to be passed, but will not allow high-frequency signals which may result from noise generated by detector 196 to pass. Low-pass filters are conventional devices which need not be described in detail herein. The output from the low-pass filter 198 may then be fed into an integrator circuit 200 which monitors the output from low-pass filter 198 over a period of time. If the output from the low pass filter 198 is relatively large for more than a transient period, the integrator circuit 200 will reflect this amplitude and generate an output signal 202. The output signal indicates the presence of a narrowband noise signal in the convolver system. A variety of integrator circuits may be used, and, of course, the amount of integration of any particular integration circuit will affect the response time of the system.

The output signal 202 from the integrator 200 may be fed into buffer amplifier 204. The buffer amplifier 204 may be used to isolate the integrator circuit 200 from succeeding circuits and to amplify the signal to a desired voltage according to the specific circuit design characteristics of a particular embodiment. The output from buffer amplifier 204 may then be fed into a compensating network 206. The purpose of the compensating network 206 is to account for nonlinear characteristics of voltage-controlled attenuators 146 and 162 and to tailor the system response as desired. This may include a comparator for comparing the output of buffer amplifier 204 to some predetermined reference level 205 so that an output control signal is produced only when the buffer amplifier output is greater than the reference level. The output from the compensating network 206 is then used as a control signal to voltage-controlled attenuators 146 and 162. In the presence of a relatively large control signal from compensating network 206, the voltage-controlled attenuators 146 and 162 will reduce the voltage into amplifiers 148 and 164 accordingly. Thus, it is possible to reduce the output from a single narrowband channel of a convolver if a high-amplitude interference signal masks the desired convolution signal on that particular channel.

One desirable feature of the subject development is that it is possible to virtually eliminate a narrowband jamming signal from a wideband signal to be monitored with a minimal loss of the signal to be monitored when a reasonable plurality of convolver channels are used in accordance with the criticality of the signal to be monitored.

Another desirable feature of the subject development is that it is possible to monitor a wideband signal with surface-acoustic-wave devices which have relatively high efficiencies over the bandwidth of the signal to be monitored.

Although the invention has been described and illustrated in detail, it is to be clearly understood that the same is by way of illustration and example only, and is not to be taken by way of limitation; the spirit and scope of the this invention being limited only by the terms of the appended claims.

We claim:

1. A signal processor for filtering a received wideband signal containing a desired signal in a coded information format and both wideband and narrowband noise, comprising:

means for partitioning said received wideband signal and a wideband reference signal that is functionally related to said coded information format into a plurality of narrowband received and reference signals;

means for convolving said narrowband received and reference signals with one another to filter said wideband noise from said received signal and to produce a plurality of narrowband output signals; and means for monitoring each of said narrowband output signals and for reducing the voltage of any narrowband signal when said signal exceeds a predetermined level.

2. A signal processor as recited in claim 1, wherein said signal partitioning means includes:

a first plurality of narrowband surface-acoustic-wave transducers, each transducer being operative over substantially successive narrowband frequency ranges extending substantially throughout the frequency range of said wideband received signal to convert said received wideband signal into said plurality of narrowband received signals so that said narrowband received signals are in the form of surface acoustic waves;

a second plurality of narrowband surface-acoustic-wave transducers being operative over substantially successive narrowband frequency ranges extending substantially throughout the frequency range of said wideband reference signal to convert said wideband reference signal into said plurality of narrowband reference signals so that said narrowband reference signals are in the form of surface acoustic waves.

3. A signal processor as recited in claim 1 or 2, wherein said monitoring means includes a plurality of monitoring networks, each network receiving as a network input signal a single one of said narrowband output signals, and producing a network output voltage which is related in amplitude to said network input signal.

4. A signal processor as recited in claim 3, wherein each of said networks includes:

a detector for receiving said network input signal and producing a voltage-varying signal which does not cross zero voltage level;

an integrating network for receiving said voltage-varying signal and producing said network output voltage; and a compensating network having as inputs said network output voltage and a reference voltage of a predetermined level and producing an output command signal only when said network output voltage exceeds said predetermined level, said command signal being used to reduce the voltage of the output of said narrowband channel.

5. A signal processor for filtering unwanted narrowband noise from wideband received electrical input signals also containing a wideband desired signal in a coded information format and wideband noise, comprising:

a plurality of surface-acoustic-wave channels, each receiving said wideband input signal and transmitting a narrowband received surface-acoustic-wave input signal portion thereupon, each of said channels also receiving a reference signal functionally related to said coded information format, and transmitting a corresponding narrowband surface acoustic reference signal thereupon toward said narrowband received surface-acoustic-wave input signal portion to suppress that portion of said wideband noise which is present in said narrowband received signal, each of said channels producing a narrowband output signal; and means for monitoring each of said narrowband output signals and for reducing the voltage of any narrowband output signal when said signal exceeds a predetermined level.

6. A signal processor as recited in claim 5, wherein each of said plurality of said surface-acoustic-wave channels further includes a narrowband transducer for receiving said wideband signal and partitioning said wideband signal into a narrowband signal to be fed into one of said plurality of surface-acoustic-wave channels.

7. A signal processor as recited in claim 5, wherein each of said plurality of surface-acoustic-wave channels further includes:

a first transducer for receiving said wideband input signal and converting said signal into said narrowband received surface-acoustic-wave input signal;

a second transducer for receiving said reference signal and converting said reference signal into said narrowband surface-acoustic-wave reference signal; and a convolver plate for transmitting said narrowband received surface-acoustic-wave input signal and said narrowband surface-acoustic-wave reference signal toward one another.

8. A signal processor as recited in claim 7, wherein said narrowband surface-acoustic-wave reference signal suppresses said wideband noise present in said narrowband signal to create a convolution voltage a(T) as said narrowband output signal where $$a(t) = \int_{-T/2}^{+T/2} f(\tau)g(2t-\tau)d\tau$$

when f=a surface wave signal generated by one transducer;

g=a surface wave signal generated by the other transducer;

T=time required for a surface wave signal to traverse the length of said convolver plate;

t=time; and $\tau$=a variable over which the above integration is performed.

9. A signal processor as recited in claim 5, further comprising:

an impedance matching and signal conditioning network to receive said narrowband output signal and condition said signal to create a 50 ohms impedance output signal.

10. A signal processor as recited in claim 5, further comprising a plurality of quadrature couplers for receiving said narrowband output signal to isolate each of said channels and to recreate first and second isolated output signals, wherein one of said first and second output signals is fed into said monitoring means, and the other of said signals is combined with output signals from all other of said plurality of said surface-acoustic-wave channels.

11. A signal processor as recited in claim 5, wherein said monitoring means includes an amplifier and filter to receive said narrowband output signal to boost and filter said signal.

12. A signal processor as recited in claim 5, wherein said monitoring means includes a detector to detect the amplitude of said narrowband output signal.

13. A signal processor as recited in claim 12, wherein said detector is an envelope detector.

14. A signal processor as recited in claim 12, wherein said detector is a rectifier detector.

15. A signal processor as recited in claim 12, wherein said detector is a full-wave rectification detection system.

16. A signal processor as recited in claim 5, wherein said monitoring means includes an integrator circuit which monitors said narrowband output signal over a period of time and creates an integrator output signal related to said narrowband output signal.

17. A signal processor as recited in claim 16, wherein when said integrated output signal exceeds a predetermined level, the voltage of the corresponding narrowband output signal is reduced.

18. A signal processor for filtering a received wideband signal containing a desired signal in a coded information format and both wideband and narrowband noise, comprising:

means for partitioning said received wideband signal and a wideband reference signal that is functionally related to said coded information format into a plurality of narrowband received and reference signals, said signal partitioning means including a first plurality of narrowband surface-acoustic-wave transducers, each transducer being operative over substantially successive narrowband frequency ranges extending substantially throughout the frequency range of said wideband received signal to convert said received wideband signal into a plurality of narrowband received signals so that said narrowband received signals are in the form of surface-acoustic-waves, said signal partitioning means further including a second plurality of narrowband surface-acoustic-wave transducers being operative over substantially successive narrowband frequency ranges extending substantially throughout the frequency range of said wideband reference signal to convert said wideband reference signal into a plurality of narrowband reference signals so that said narrowband reference signals are in the form of surface-acoustic-waves;

means for convolving said narrowband received and reference signals with one another to filter said wideband noise from said received signals to produce a plurality of narrowband output signals; and means for monitoring each of said narrowband output signals and for reducing the voltage of any narrowband signal when said signal exceeds a predetermined level, said monitoring means including a plurality of monitoring networks, each network receiving as a network input signal a single one of said narrowband input signals, and producing a network output voltage which is related in amplitude to said network input signal, wherein each of said networks includes a detector for receiving said network input signal and producing a voltage-varying signal which does not cross zero voltage level, each of said networks further includes an integrating network for receiving said voltage-varying signal in producing said network output voltage, each of said networks further including a compensating network having as input said network output voltage and a reference voltage of a predetermined level and producing an output command signal only when said network output voltage exceeds said predetermined level, said command signal being used to reduce the voltage of the output of said narrowband channel.

19. A signal processor for filtering unwanted narrowband noise from wideband received electrical input signals also containing a wideband desired signal in a coded information format and wideband noise, comprising:

a plurality of surface-acoustic-wave channels, each receiving said wideband input signal and transmitting a narrowband received surface-acoustic-wave input signal portion thereon, each of said channels also receiving a reference signal functionally related to said coded information format, and transmitting a corresponding narrowband surface acoustic reference signal thereupon towards said narrowband received surface-acoustic-wave input signal portion to suppress that portion of said wideband noise which is present in said narrowband received signal, each of said channels producing a narrowband output signal;

means for monitoring each of said narrowband output signals and for reducing the voltage of any narrowband output signal when said signal exceeds a predetermined level; and a plurality of quadrature couplers for receiving said narrowband output signal to isolate each of said channels and to recreate first and second isolated output signals, wherein one of said first and second output signals is fed into said monitoring means, and the other of said signals is combined with output signals from all other of said plurality of said surface-acoustic-wave channels.

20. A signal processor as recited in claim 19, wherein each of said plurality of said surface-acoustic-wave channels further includes a narrowband transducer for receiving said wideband signal and partitioning said wideband signal into a narrowband signal to be fed into one of said plurality of surface-acoustic-wave channels.

21. A signal processor as recited in claim 19, further comprising a hybrid signal splitter for splitting said wideband received electrical input signals into a plurality of wideband signals, each of said wideband signals being fed into one of said surface-acoustic-wave channels.

22. A signal processor as recited in claim 21, further comprising a voltage-controlled attenuator to receive said wideband signal prior to being fed into one of said surface-acoustic-wave channels and to attenuate said signal in accordance with said monitoring means.

23. A signal processor as recited in claim 19, further comprising a signal conditioning network to condition said wideband signal prior to being received by each of said plurality of surface-acoustic-wave channels.

24. A signal processor as recited in claim 19, wherein each of said plurality of surface-acoustic-wave channels further includes:

a first transducer for receiving said wideband input signal and converting said signal into said narrowband received surface-acoustic-wave input signal;

a second transducer for receiving said reference signal and converting said reference signal into said narrowband surface-acoustic-wave reference signal; and a convolver plate for transmitting said narrowband received surface-acoustic-wave input signal and said narrowband surface-acoustic-wave reference signal toward one another.

25. A signal processor as recited in claim 19, wherein said monitoring means includes a detector to detect the amplitude of said narrowband output signal.

26. A signal processor as recited in claim 25, wherein said detector is an envelope detector.

27. A signal processor as recited in claim 25, wherein said detector is a rectifier detector.

28. A signal processor as recited in claim 25, wherein said detector is a full-wave rectification detection system.

29. A signal processor as recited in claim 19, wherein said monitoring means includes an integrator circuit which monitors said narrowband output signal over a period of time and creates an integrator output signal related to said narrowband output signal.

30. A signal processor as recited in claim 29, wherein when said integrated output signal exceeds a predetermined level, the voltage of the corresponding narrowband output signal is reduced.

* * * * *